United States Patent [19]

Sorgi et al.

[11] Patent Number: 4,742,391
[45] Date of Patent: May 3, 1988

[54] DPCM VIDEO SIGNAL COMPRESSION AND TRANSMISSION SYSTEM AND METHOD

[75] Inventors: Aladino D. Sorgi, San Diego; Jerry Zinkovich, Santee, both of Calif.

[73] Assignee: Cubic Corporation, San Diego, Calif.

[21] Appl. No.: 4,040

[22] Filed: Jan. 16, 1987

[51] Int. Cl.⁴ .......................... H04N 7/12; H04N 7/13
[52] U.S. Cl. ...................................... 358/133; 358/135
[58] Field of Search .................... 358/13, 12, 135, 136, 358/133, 335; 375/27, 28, 31

[56] References Cited

U.S. PATENT DOCUMENTS

| | | | |
|---|---|---|---|
| 3,772,458 | 11/1973 | May et al. | 178/6 |
| 4,179,710 | 12/1979 | Ishiguro et al. | 358/135 |
| 4,196,448 | 4/1980 | Whitehouse et al. | 358/135 |
| 4,200,886 | 4/1980 | Musmann et al. | 358/135 |
| 4,238,768 | 12/1980 | Mitsuya et al. | 358/135 |
| 4,255,763 | 3/1981 | Maxemchuk et al. | 358/135 |
| 4,292,651 | 9/1981 | Kretz et al. | 358/135 |
| 4,386,366 | 5/1983 | Mori | 358/135 |
| 4,411,001 | 10/1983 | Van Buul et al. | 375/30 |
| 4,430,670 | 2/1984 | Netravali | 358/135 |
| 4,435,726 | 3/1984 | Liao | 358/135 |
| 4,622,585 | 11/1986 | Reitsma | 358/133 X |
| 4,661,862 | 4/1987 | Thompson | 358/133 X |

Primary Examiner—Howard W. Britton
Assistant Examiner—Victor R. Kostak
Attorney, Agent, or Firm—Brown, Martin, Haller & Meador

[57] ABSTRACT

A DPCM video transmission system includes an encoder comprising a single PROM having as its inputs an input video signal and a feedback signal connected to the PROM via a digital latch clocked to produce one pixel delay in the signal. The PROM is preprogrammed with a table comprising all the possible DPCM encoded output signals and feedback signals for each possible pair of input signals according to the preselected quantization characteristics. Similarly, a decoder for receiving the compressed signal and reconverting it into an expanded video signal comprises a single PROM preprogrammed with a table of all the possible reconstructed values, the PROM having as its inputs the compressed signal and a delayed output signal coupled to the input via a latch clocked to produce one pixel delay in the signal. This technique can be used for any selected video signal length, quantization levels and associated ranges, as long as a PROM with sufficient storage capacity for the generated tables is available.

6 Claims, 4 Drawing Sheets

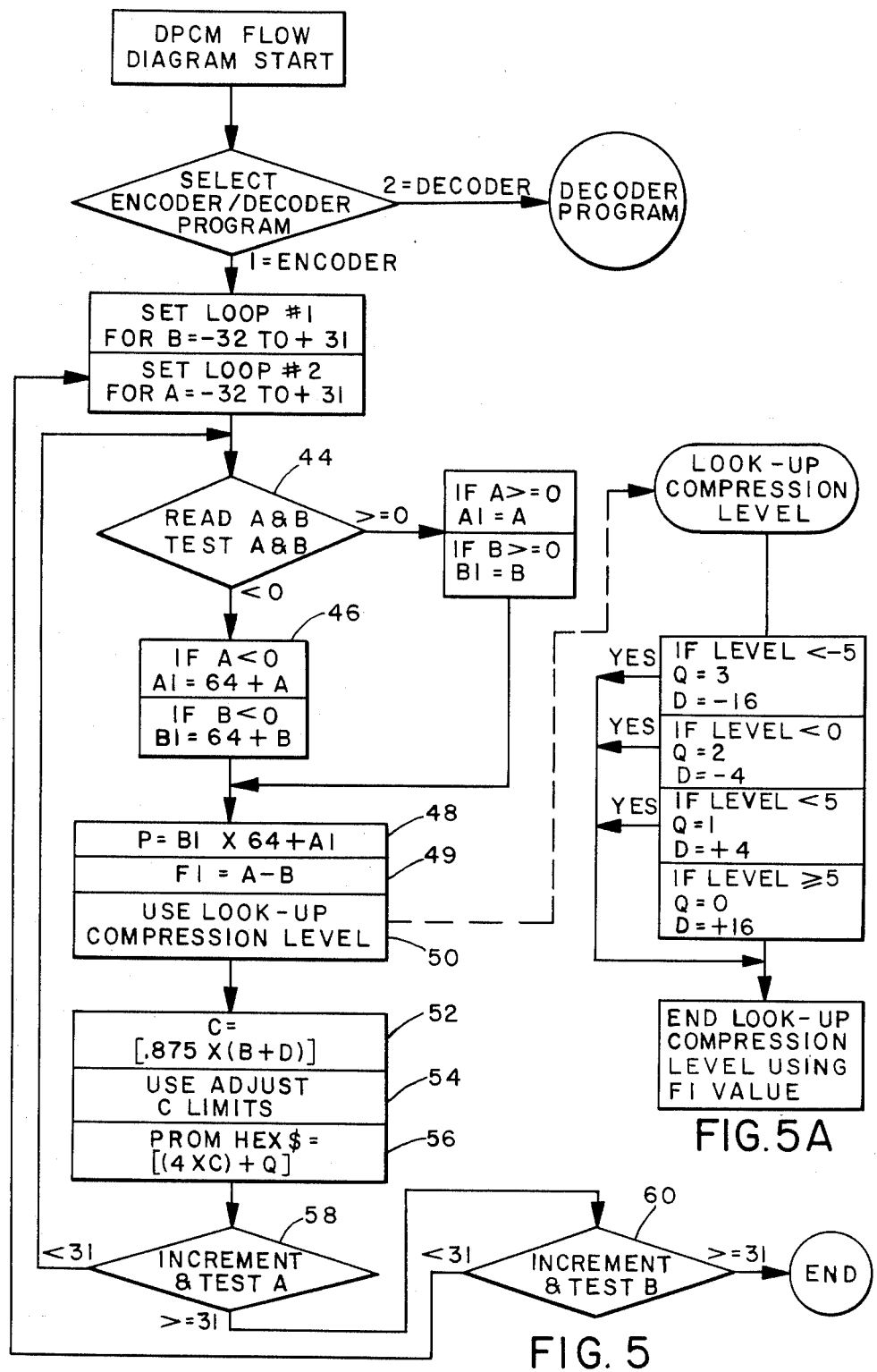

DPCM VIDEO SIGNAL COMPRESSION AND TRANSMISSION SYSTEM AND METHOD

BACKGROUND OF THE INVENTION

The present invention relates to a differential pulse code modulation (DPCM) system for compressing and subsequently reexpanding video signals utilizing digital coding.

Video signals typically have many repeated sample values, and there is little information in the transmission of the repeated values. Thus video bandwidth compression is commonly used to reduce the actual data transmission rate, particularly when the transmit bandwidth is limited or processing gain against an external noise jammer is a requirement.

One way in which messages having repeated sample values can be compressed is to transmit only the digitally encoded differences between successive sample values. This technique is known as differential pulse code modulation (DPCM). This type of system reduces both the time and cost of transmitting a signal in a narrow bandwidth.

A typical DPCM transmission system comprises a transmitter for transmitting a video signal and a receiver for receiving the signal, the transmitter including a DPCM encoding and decoding arrangement, and the receiver including a DPCM decoding arrangement for reconstructing the coded video signal.

In a DPCM encoder, the value of an image sample is predicted and the difference between the actual and the predicted value is quantized and transmitted. At the decoder, a similar predictor uses the transmitted values of the quantized difference signal to reconstruct the scanned image sample. The basic block circuit diagrams for a simple DPCM encoder and decoder are shown in FIGS. 1 and 2, described in more detail below. Modifications of such systems are described, for example, in U.S. Pat. No. 4,200,886 of Musmann et al., U.S. Pat. No. 4,292,651 of Kretz et al., and U.S. Pat. No. 4,386,366 of Mori.

In the encoder, an input digitized video signal A containing an N bit word per picture element (pixel) comprises the encoder input. A digital prediction value B is subtracted from the input signal A in a suitable subtractor circuit to form a difference signal E which is quantized by quantizer Q. Quantizer Q is selected to have a predetermined quantization characteristic consisting of L quantization levels each corresponding to a predetermined range of the input signal. Quantizer Q produces a quantized difference signal output. This output is transmitted to a suitable receiver and also connected to a predictor circuit to produce prediction value B. The predictor circuit typically comprises a $Q^{-1}$ recontructor to reconstruct the difference signal D, an addition circuit to add signal D to prediction value B, a feedback multiplier to multiply the output of the addition circuit by a chosen feedback coefficient, and a latch clocked to produce one pixel delay in the prediction value B so that each incoming signal has a value B reconstructed from the coded output signal of the preceding signal subtracted from it.

At the receiver, the received signal is decoded and the recovered difference signal D is added to prediction value B in order to regenerate the quantized signal.

DPCM techniques of this type have up to now employed a lot of digital circuitry working at high speeds, typically up to 30 or more integrated circuits for carrying out the various functions of the encoder and decoder. These circuits may take up to 4 or 5 circuit boards, requiring a lot of space and having relatively high power consumption. Thus their use is limited where the space, weight and power available is restricted, for example in aircraft, satellites and the like. There is therefore a need for DPCM systems utilizing a minimum of circuitry.

SUMMARY OF THE INVENTION

According to the present invention a DPCM transmission system is provided in which previously generated tables of feedback values and DPCM encoded output values for a chosen quantization characteristic are stored in a single PROM having as its input addresses the input video signal and a feedback signal connected to the PROM input via a digital latch producing one pixel delay in the signal. Thus, instead of providing digital circuitry for carrying out the various DPCM functions, all the possible coded outputs and feedback values are first generated and stored in the form of look-up tables in a single PROM, which can be provided on a single chip and takes up considerably less space than previous DPCM systems. Also, this system will use considerably less power than previous DPCM encoders.

Similarly, the DPCM decoder also comprises a single PROM in which previously generated reconstructed values according to each possible pair of input coded signal and feedback signal are stored. The decoder PROM has as its input addresses the coded output signal produced by the encoder and a feedback signal connected between the decoder output and the decoder input via a digital latch producing one pixel delay in the signal. Thus the decoder is also compressed into two basic components, which may each comprise a single chip and are significantly more compact, lightweight and have lower power consumption than previous DPCM decoder circuits.

BRIEF DESCRIPTION OF THE DRAWINGS

The present invention will be better understood from the following detailed description of a preferred embodiment of the invention, taken in conjunction with the accompanying drawings, in which like reference numerals refer to like parts and in which:

FIGS. 5 and 5A are block flow diagrams showing the steps for generating the DPCM encoder data for storage in the PROM of FIG. 3.

DESCRIPTION OF THE PREFERRED EMBODIMENT

Figure 1:
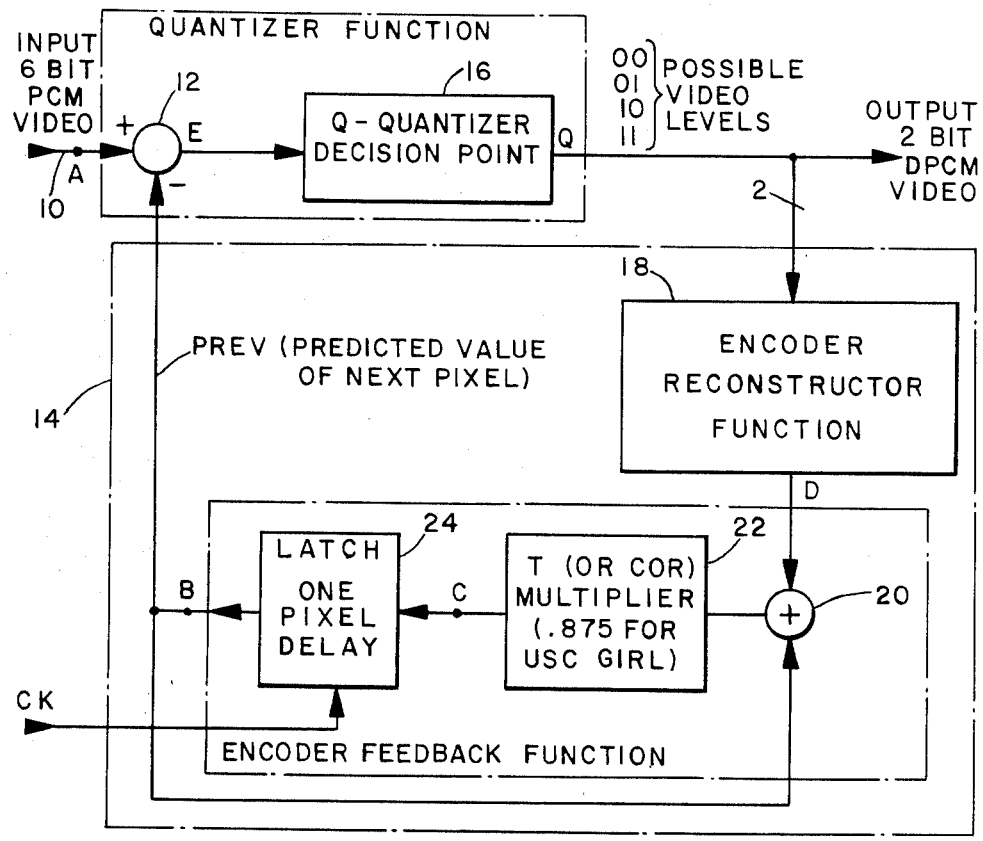
FIG. 1 is a block diagram showing a prior art DPCM video encoder.
Figure 2:
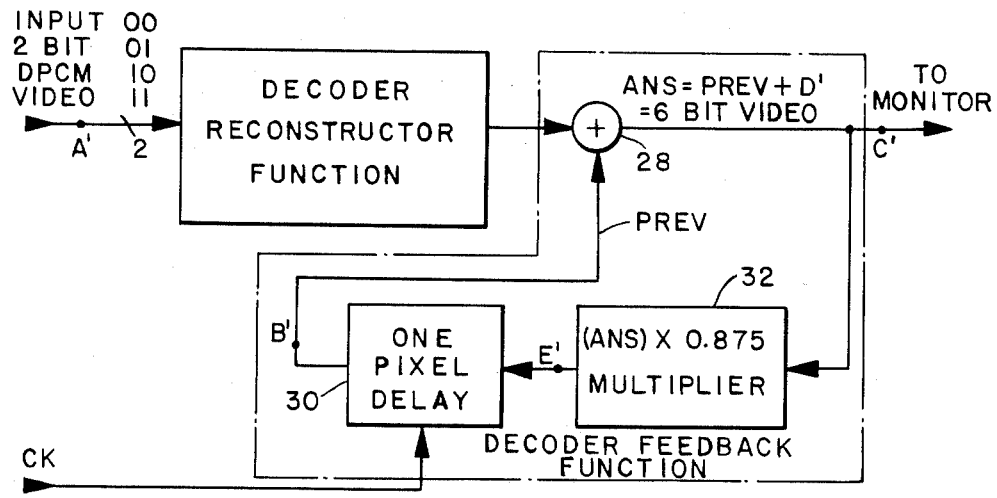
FIG. 2 is a block diagram showing a prior art DPCM video decoder.

FIGS. 1 and 2 of the drawings show a known technique of DPCM encoding and decoding, respectively, in which a video signal is compressed into a digitally encoded difference signal for transmission to a receiver, and subsequently reexpanded into a corresponding reconstructed video signal for display on a monitor.

A video signal consists of a series of picture elements each of which has information concerning the brightness level of that element, ranging from all black to all white. In the DPCM technique each analog video signal value is converted via an analog to digital converter (not shown) to produce a digital signal containing an n bit word per picture element (pixel). In the conventional system shown in FIG. 1 this digital signal A comprises the input 10 to the DPCM encoder circuit. In the system shown in FIGS. 1 and 2 a 6 bit video signal is produced. However, video signals having a greater or lesser number of bits per word or sample value may be used.

In the circuit shown in FIG. 1 the input A is connected to a subtractor circuit 12 in which a digital prediction value B generated by predictor circuit 14 is subtracted from the input A to produce a difference signal E. Difference signal E is quantized in a quantizer 16 to produce a quantized difference signal Q. Subtractor 12 and quantizer 16 provide the encoder quantization function having input A and output Q. The quantizer has a selected quantization characteristic consisting of a plurality of quantization levels (4 is this example) each corresponding to a predetermined range of input levels of the difference signal E. Thus, for input difference signals in each selected range, the corresponding quantization level will be selected and provided at the output of quantizer 16. This output is coded into constant length code words which are shorter than the input video signal and are transmitted to a receiver. Thus, a fixed length code is provided for each quantization level. In this example the quantized difference signal is converted into a 2 bit DPCM encoded video signal.

The output 2 bit signal is also connected to predictor circuit 14. The first stage of predictor 14 is a $Q^{-1}$ reconstructor function 18 in which a difference signal D is reconstructed from the 2 bit output signal. The reconstructor basically comprises an inverse quantizer having the same quantization characteristic as quantizer 16 and a preselected reconstruction value for each value of the quantized difference signal. The output D is reconstructor 18 is connected to an adder circuit 20 where it is added to previous prediction value B. The output of adder 20 is multiplied in feedback multiplier 22 by the selected feedback coefficient (in this case the coefficient is 0.875 for USC GIRL, although other coefficients may be used). The output C of multiplier 22 is connected via a latch 24 back to the subtractor 12. The latch is clocked by clock signal CK to produce one pixel delay in signal C. Thus the reconstructed value C of each incoming video signal is subtracted from the next successive video signal to produce the difference signal E. The adder circuit 20, feedback multiplier 22 and latch 24 provide the encoder feedback function.

One requirement for a DPCM circuit carrying out these functions is speed, since it must be able to take and process samples at the video rate, typically 80 to 85 nanoseconds. The encoder function circuit illustrated in FIG. 1 has up to now conventionally been made from a plurality of integrated circuits for carrying out the various steps repeatedly for each incoming sample value. This can require up to 30 or more integrated circuits, depending on the particular quantization characteristics and video input ranges.

The encoded signal produced by the DPCM encoder of FIG. 1 is transmitted to a suitable receiver incorporating a conventional DPCM decoder circuit, for example of the simple type illustrated in FIG. 2. Again this is normally made up of a number of high speed integrated circuits for performing the various DPCM decoding functions for each incoming coded signal. As shown in FIG. 2, the input 2 bit video signal A' is connected to a $Q^{-1}$ reconstructor 26 of the same type as reconstructor 18 in the predictor circuit of FIG. 1. Thus, reconstructor 26 provides a decoder reconstruction function and will produce output D', which is equivalent to reconstructor 18 output D in FIG. 1, since it has the same inverse quantization characteristics.

Output D' is connected to an adder circuit 28 where it is added to a feedback signal PREV or B' comprising the previous output signal C' which is fed back to adder circuit 28 via a digital latch 30 for producing one pixel delay in the signal. Digital latch has a clock input CK. The output of the adder circuit is connected to the latch 30 via feedback multiplier 32 having the same coefficient (e.g. 0.875 for USC GIRL) as feedback multiplier 22 in FIG. 1. Thus the output signal ANS or C' connected to an A to D converter and suitable video monitor comprises the sum of the reconstructed difference signal D' and the previous output signal. Adder circuit 28, feedback multiplier 32, and latch 30 provide the decoder feedback function.

Up to now the various DPCM encoding and decoding functions described above have been carried out in integrated circuits. According to the present invention a technique is provided for compressing each of the DPCM encoder and decoder circuits into a single PROM (programmable read only memory) and latch. The technique involves first generating all the possible values in each circuit for a given range of input values and selected quantization characteristics, and then programming these values into the PROM in the form of look-up tables which simulate the encoder and decoder functions. Although in the description below video signal lengths of 6 and 2 bits, respectively, are used, for a signal range from −32 to +31, and a 4 level quantization characteristic is selected, clearly the same technique could be used for different video signal lengths and ranges and for different selected quantization characteristics. The technique is only limited by the size and speed of PROM available, as will be explained in more detail below. Thus the values and characteristics described below are by way of example only and it will be understood by those skilled in the field that alternatives may be used.

Figure 3:
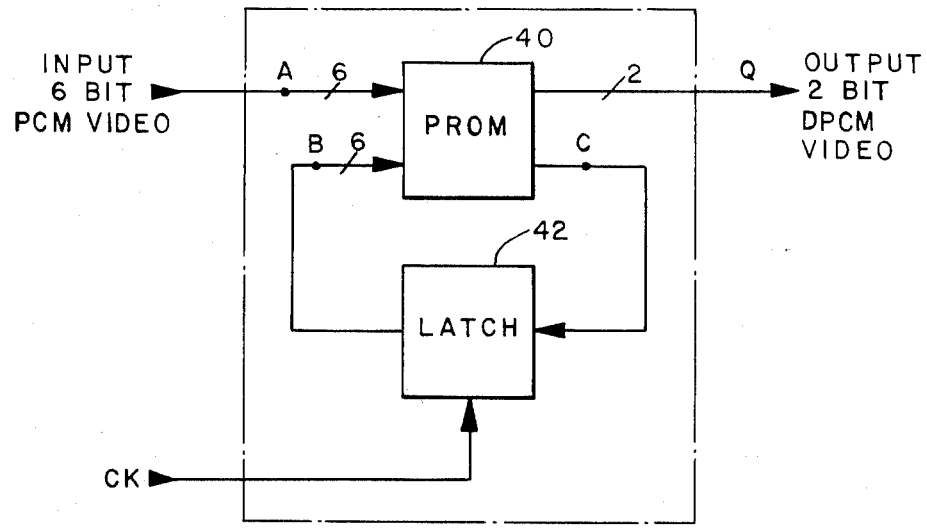
FIG. 3 is a block diagram showing the DPCM video encoder according to a preferred embodiment of the present invention.
Figure 4:
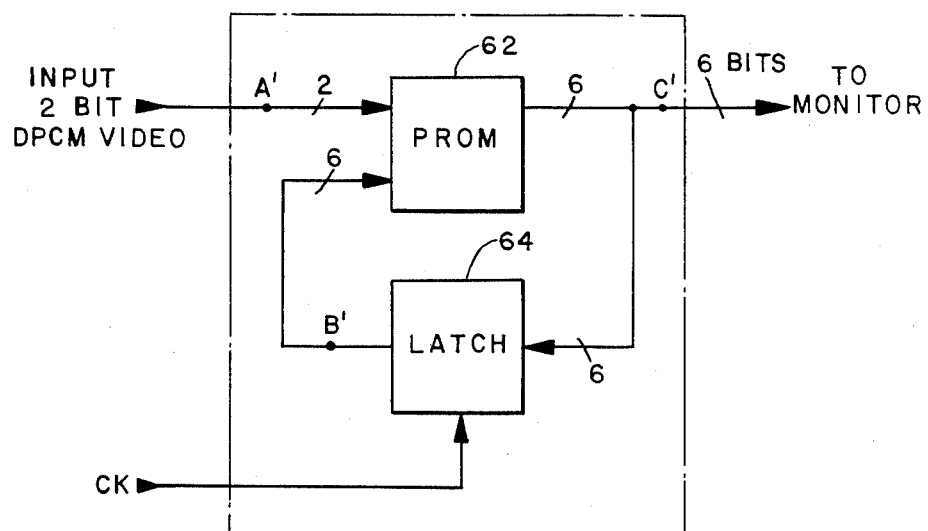
FIG. 4 is a block diagram showing the DPCM video decoder according to the preferred embodiment of the present invention.

FIGS. 3 and 4 of the drawings show a DPCM encoder and decoder, respectively, according to a preferred embodiment of the present invention. In the encoder of FIG. 3 all the functions of the encoder of FIG. 1 have been compressed into a single encoder PROM 40 and a digital latch 42. These components may be provided in the form of two integrated circuits, or may be provided on a single VLSI (very large scale integration) chip. Thus, the complete encoder circuit is compressed into two off-the-shelf integrated circuit devices, which are small, lightweight, and have significantly lower power consumption than standard, multicomponent DPCM circuits.

The PROM 40 has two 6 bit video inputs A and B comprising the incoming video signal which has first been modified in an A/D converter (not shown), and a feedback signal connected between PROM output C and the input B via digital latch 42. A clock input CK connected to latch 42 provides one pixel delay in the signal. Input A therefore represents the quantizer function input of FIG. 1, input B is the feedback input, output Q is the quantizer function output, and output C is the feedback function output.

PROM 40 has stored in its memory previously generated values of the 2-bit coded quantizer function output signal Q and the reconstructed video feedback signal C. These values are computer generated as shown generally in the flow diagram of FIGS. 5, 5A. Basically, the circuit steps of FIG. 1 are computer-simulated by a program following the steps of FIG. 5 so that every possible combination of input signal A, feedback input B, reconstructed signal C, and output signal Q, is generated. These values are then stored in PROM 40 such that for every pair of input addresses A and B the corresponding output signals Q and C are generated at the PROM outputs. The reconstructed signal C comprises an algorithm of the incoming video signal and thus for each video signal a previously generated feedback value C is stored.

The flow diagram of FIGS. 5, 5A uses values of A and B from $-32$ to $+31$ and has two loops, one for incrementing the values of A and one for incrementing the values of B in the designated range. Steps 44 and 46 adjust the values for negative A and B. In step 48, a PROM address P is calculated for the current values A1 and B1 in each loop. A value F1 calculated in step 49 comprises the subtraction of B from A, simulating subtractor circuit 12 in FIG. 1. Step 50 is a sub-routine for looking up the compression, or quantization level. This effectively simulates the quantizer function of FIG. 1. The look-up code is shown in FIG. 5A. In the illustrated example the following levels are used:

If $F1 < -5$, $Q=3$ (2 bit code 11)
If $-6 < F1 < 0$, $Q=2$ (2 bit code 10)
If $-1 < F1 < 5$, $Q=1$ (2 bit code 01)
IF $F1 > 4$, $Q=0$ (2 bit code 00),
where Q is the 2 bit compression code (Q in FIG. 3).

In the next step 52 a feedback value C is calculated from the expression:

$$C = [0.875 \times (B+D)]$$

where 0.875 is the selected feedback coefficient and D is the reconstruction level. The following reconstruction levels are selected in the illustrated example:
If $Q=3$, $D=-16$
If $Q=2$, $D=-4$
If $Q=1$, $D=+4$
If $Q=0$, $D=+16$
where Q is the two bit compression output code. Thus step 52 simulates the reconstructor, adder and feedback multiplier of the predictor 14 in FIG. 1.

Figures 6, 6A, 6B:
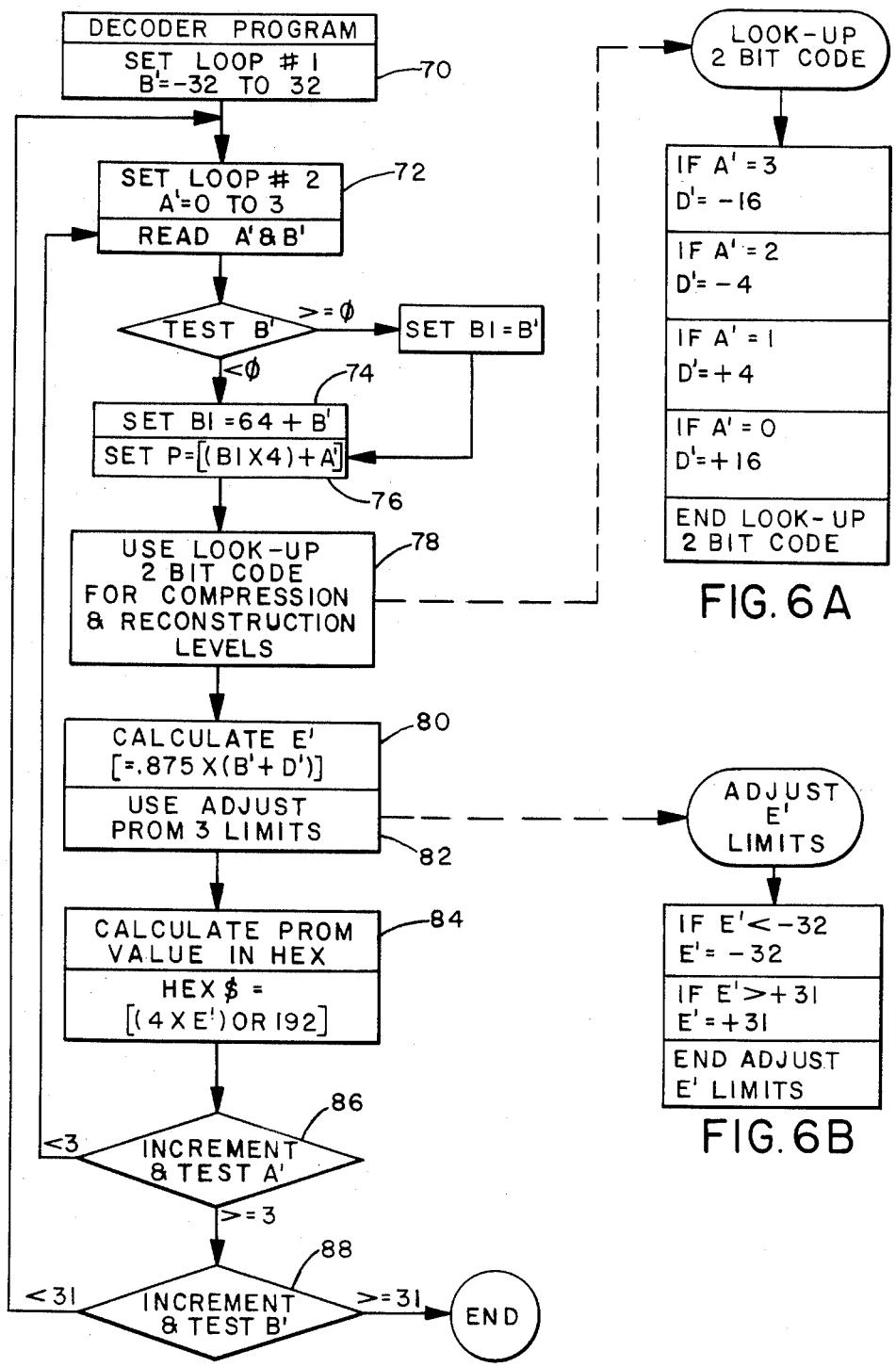
FIGS. 6, 6A and 6B are a block flow diagrams showing the steps for generating the DPCM decoder data for storage in the PROM of FIG. 4.

The next step 54 guarantees that all values of C outside the range of $-32$ to $+31$ are forced to the appropriate end point. Since these values correspond to total black or total white input signals, this adjustment will have little effect on the final video signal at the receiver monitor. Basically, as shown in FIG. 6B, if C is greater than $+31$, it is adjusted to be $+31$, and if it is less than $-32$, it is adjusted to be $-32$. Step 56 converts the PROM value to HEX or a 6 bit code ($4 \times C$ is the PROM location scale factor at the output).

The next two steps 58 and 60 increment the values of A and B for each loop of loop 1 and loop 2 of the program. Thus the program illustrated by the flow diagram of FIG. 1 will calculate outputs Q and C for a range of values of A with B fixed at one value. Then B is incremented to a new value and the above process is repeated until all values of B have been considered. These values are stored as PROM code in the selected encoder PROM 40. Table 1 shows a suitable computer program for carrying out the steps illustrated in the flow chart of FIG. 5 to generate the encoder PROM code tables.

TABLE 1

| | | |
|---|---|---|
| 10 | REM | |
| 20 | REM | THIS IS THE DPCM MODEL |
| 30 | REM | |
| 32 | WIDTH | "LPT1:", 132 |
| 34 | CLEAR | 3200 |
| 40 | | INPUT "WHAT IS TODAY'S DATE";D$ |
| 50 | | DIM A(128), AP(128), PROM$(4096) |
| 60 | | INPUT "SELECT 1=ENCODER/2=DECODER";Y |
| 70 | | IF Y<1 OR Y>2 THEN 60 |
| 80 | | INPUT "DO YOU WANT TO SAVE DATA ON DISK";N$ |
| 90 | | IF LEFT$(N$,1)="N" OR LEFT$(N$,1)="n" THEN H=0 ELSE H=1: GOSUB 890 |
| 100 | | ON Y GOSUB 130,480 |
| 110 | | END |
| 120 | REM | |
| 130 | REM | THIS IS THE ENCODER |
| 140 | | LPRINT "THIS IS THE DPCM ENCODER",D$ |
| 150 | | FOR B=$-32$ TO 31 |
| 160 | | PRINT:PRINT "B";B |
| 170 | | LPRINT:LPRINT "B=";B |
| 180 | | FOR A=$-32$ TO 31 |
| 190 | | IF A<0 THEN A1=64+A ELSE A1=A |
| 200 | | IF B<0 THEN B1=64+B ELSE B1=B |
| 210 | | P=(B1*64)+(A1) |
| 220 | | F1=A$-$B |
| 230 | | IF F1<$-5$ THEN Q=3:D=$-16$: GOTO 270 |
| 240 | | IF F1<0 AND F1>$-6$ THEN Q=2:D=$-4$:GOTO 270 |
| 250 | | IF F1<5 AND F1>$-1$ THEN Q=1:D=+4:GOTO 270 |
| 260 | | IF F1> 4 THEN Q=0:D=+16 |
| 270 | | C=INT(.875*(B+D)) |
| 280 | | IF C<$-32$ THEN C=$-32$ |
| 290 | | IF C>+31 THEN C3=+31 |
| 300 | | A(C+64)=A(C+64)+1 |
| 310 | | PROM$=RIGHT$$("00"+HEX$(C*4+Q),2) |
| 330 | | LPRINT " P=";USING"####";P; |
| 340 | | LPRINT "@"USING"####";A;F1;Q;D;C; |
| 350 | | LPRINT "*";PROM$;"*"; |
| 360 | | IF P MOD (4)=3 THEN LPRINT |
| 370 | | IF H=0 THEN GOTO 400 |
| 380 | | RSET DPROM$=PROM$ |
| 390 | | PUT #1,P+1 |
| 400 | | NEXT A |
| 420 | | NEXT B |
| 430 | | CLOSE |
| 440 | | GOSUB 1260 |
| 450 | | GOSUB 800 |
| 460 | | GOSUB 980 |
| 470 | REM | RETURN |

The encoder PROM must have 12 inputs (for the two 6 bit input signals A and B) and 8 outputs, and must be capable of storing the computer generated data outlined above, i.e. in the selected example a 4K×8 PROM is required for storage of the generated table of values. Also, the PROM must be capable of taking samples at the incoming video rate, i.e. at a clock speed of 80 to 85 nanoseconds. In one particular example of the invention encoder PROM 40 was a Harris HM 76321, Advanced Micro Devices 27S43, or equivalent. Latch 42 is a standard digital latch. A suitable digital clock signal CK is provided in a known manner at the same rate as the A/D converter for producing the 6 bit video input signal A.

FIG. 6 is a flow diagram illustrating the steps for generating the data for the decoder of FIG. 4. The two component circuit of FIG. 4 replaces the standard multi component decoder of the type illustrated in FIG. 2 with a single decoder PROM 62 and latch 64 for producing one pixel delay in the signal, in a similar manner to encoder circuit of FIG. 3. PROM 62 and latch 64 therefore simulate the decoder reconstruction and feedback functions of FIG. 2. As in the previous embodiment, the components 62 and 64 may be provided in the form of two off-the-shelf dual in line integrated circuit devices, or in the form of a single VLSI chip.

One of the inputs to decoder PROM 62 comprises the compressed 2 bit video signal or reconstruction function input A', while the other input comprises a feedback signal B connected between the reconstructor function output C' of PROM 62 and feedback input B' via the latch 64. Latch 64 is clocked by signal CK to produce one pixel delay in signal C'.

FIG. 6 illustrates a flow diagram for computer generation of the compression data for storage in PROM 62. As in the previous embodiment, steps in the computer program simulate functions normally carried out electronically in a DPCM decoder circuit to generate all the possible values of the reconstructed video signal C' for each pair of signals A' and B'. A computer program for carrying out the steps shown in FIG. 6 is shown by way of example in Table 2, although clearly alternative programs may be used, as will be understood by those skilled in the field. Table 2 also includes a PRINT (line 1260) and PROM DUMP (line 980) subroutine for both the encoder and decoder program.

TABLE 2

| | | |
|---|---|---|
| 480 | REM | THIS IS THE DECODER |
| 482 | REM | NOTE: USE VARIABLE P FOR ' EX: AP=A' |
| 490 | | LPRINT "THIS IS THE DPCM DECODER",D$ |
| 500 | | FOR BP=−32 TO 31 |
| 510 | | PRINT:PRINT "BP=";BP |
| 520 | | LPRINT "BP=";BP;TAB(12); |
| 530 | | FOR AP=0 TO 3 |
| 540 | | IF BP<0 THEN B1=64+BP ELSE B1=BP |
| 550 | | P=(B1*4)+(AP) |
| 560 | | IF AP=3 THEN DP=−16:GOTO 600 |
| 570 | | IF AP=2 THEN DP=−4:GOTO 600 |
| 580 | | IF AP=1 THEN DP=+4:GOTO 600 |
| 590 | | IF AP=0 THEN DP=+16 |
| 600 | | EP=INT(.875*(BP+DP)) |
| 610 | | IF EP<−32 THEN EP=−32 |
| 620 | | IF EP>+31 THEN EP=+31 |
| 630 | | AP(EP+64)=AP(EP+64)+1 |
| 640 | | PROM$=RIGHT$("00"+HEX$ (EP OR 192),2) |
| 650 | | LPRINT " P=";USING"####";P; |
| 660 | | LPRINT "@"USING "####";AP;DP;EP; |
| 670 | | LPRINT "*";PROM$;"*"; |
| 680 | | IF P MOD (4)=0 THEN LPRINT |
| 690 | | IF H=0 THEN GOTO 720 |
| 700 | | RSET DPROM$=PROM$ |
| 710 | | PUT #1,P+1 |
| 720 | | NEXT AP |
| 730 | | NEXT BP |
| 740 | | CLOSE |
| 750 | | GOSUB 1260 |
| 760 | | GOSUB 800 |
| 770 | | GOSUB 980 |

TABLE 2-continued

| | | |
|---|---|---|
| 780 | | RETURN |
| 790 | REM | |
| 800 | | LPRINT:LPRINT |
| 810 | | FOR A=0 TO 127 |
| 812 | | IF Y=1 THEN LPRINT 37 3=";A=64;TAB (10);"C USE=";A(A) |
| 820 | | IF Y=2 THEN LPRINT "BP=";A−64;TAB (10);"EP USE=";AP(A) |
| 830 | | NEXT A |
| 840 | | LPRINT:LPRINT |
| 850 | | RETURN |
| 870 | REM | |
| 880 | REM | OPEN DISK FILE |
| 890 | | IF Y=2 THEN GOTO 930 |
| 900 | | OPEN "R",#1,"ENCODER.DAT",2 |
| 910 | | FIELD #1,2 AS DPROM$ |
| 920 | | RETURN |
| 930 | | OPEN "R",#1,"DECODER.DAT",2 |
| 940 | | FIELD #1,2 AS DPROM$ |
| 950 | | RETURN |
| 960 | REM | |
| 980 | REM | THIS IS THE PROM DUMP ROUTINE |
| 990 | | IF Y<1 OR Y >2 THEN INPUT "SELECT 1=ENCODER/2=DECODER";Y |
| 1000 | | GOSUB 890      :REM OPEN FILE |
| 1010 | | IF Y=1 THEN Y1=4096: Y$=" ENCODER  ELSE Y1=256: Y$=" DECODER " |
| 1020 | | FOR A=0 TO Y1−1 |
| 1030 | | GET #1,A+1 |
| 1040 | | PROM$(A)=DPROM$ |
| 1050 | | NEXT A |
| 1060 | | CLOSE |
| 1070 | | LPRINT CHR$(12):LPRINT:LPRINT |
| 1080 | | LPRINT "THIS IS THE DPCM" ;Y$;"HEX PROM DUMP",D$ |
| 1090 | | LPRINT:LPRINT |
| 1100 | | CA=INT(Y1/12) |
| 1110 | | FOR A1=0 TO CA |
| 1120 | | FOR A2=0 TO 11 |
| 1130 | | A=(A1+(CA+1)*A2) |
| 1140 | | IF A>4096 THEN GOTO 1170 |
| 1150 | | LPRINT USING "####";A; |
| 1160 | | LPRINT "=";PROM$(A);" "; |
| 1170 | | NEXT A2 |
| 1180 | | LPRINT |
| 1190 | | PRINT "LINE#=";A1;"TO";CA |
| 1200 | | NEXT A1 |
| 1210 | | INPUT "DO YOU WANT TO PRINT MORE PROM DATA";Y$ |
| 1220 | | IF LEFT$(Y$,1)="Y" OR LEFT$(Y$,1)="y" THEN Y=0: GOTO 990 |
| 1230 | | RETURN |
| 1240 | REM | |
| 1250 | | REM NOTES: |
| 1260 | | LPRINT:LPRINT |
| 1270 | | LPRINT "B=ENCODER FEEDBACK" |
| 1280 | | LPRINT "P=PROM POINTED (INPUT ADDRESS)" |
| 1290 | | LPRINT "A=@=VIDEO INPUT LEVEL" |
| 1300 | | LPRINT "F1=VIDEO MINUS FEEDBACK" |
| 1310 | | LPRINT Q=TWO BIT COMPRESSION CODE" |
| 1320 | | LPRINT D=RECONSTRUCTION LEVEL" |
| 1330 | | LPRINT C=NEXT FEEDBACK LEVEL" |
| 1340 | | LPRINT "UPPER PROM$=4 TIMES FEEDBACK LEVEL" |
| 1350 | | LPRINT "LOWER PROM$=TWO BIT COMPRESSION CODE" |
| 1360 | | LPRINT CHR$(12) |
| 1370 | | RETURN |

As in the encoder program, the decoder program illustrated in FIG. 6 has two loops, one for incrementing values of A' between the possible values 0, 1, 2 and 3, and one for incrementing values of B between −32 and +31 (steps 70 and 72). Step 74 adjusts for negative values of B. Step 76 calculates a prom address P. In step 78, look-up codes (see FIG. 6A) are utilized for the compression code and reconstruction levels, as in the encoder example. This produces a reconstruction level D' which is equivalent to the output D' of reconstructor in FIG. 2. This step therefore simulates the decoder reconstruction function In step 78, the feedback value is calculated from the relationship:

$$E' = [0.875 \times (B' + D')],$$

simulating the adder circuit and feedback multiplier of FIG. 2. It is this feedback value which will be connected to latch 64 in FIG. 4. Step 82 (FIG. 6B), guarantees that all value of E' outside the range of −32 to +31 are forced to the appropriate end points. If E' is greater than +31, it is adjusted to 31, and if it is less than −32, it is adjusted to be −32 as in the encoder example.

In step 84, the PROM value is calculated in HEX or 6 bit code. Steps 86 and 88 increment the values of A' and B, respectively, for the two loops of the program.

This program generates tables of values of A', B' and C' for storage in decoder PROM 62, where they act as look-up tables for each incoming value of A' and B'.

The decoder PROM 62 can be smaller than the encoder PROM since it needs only 8 inputs and 6 outputs to expand an incoming compressed 2 bit signal to a 6 bit video signal. A memory of at least 256×8 for storage of the look up tables is required, and a 512×8 decoder PROM is used in the preferred embodiment. This may comprise a Harris HM −7640, 41 or 49/A, an Advanced Micro Design 27S30, 31 or 29, or equivalent component.

Thus in the present invention instead of providing electronic circuit elements for carrying out the various DPCM encoding and decoding steps instantaneously with each incoming sample value, a computer program is first utilized to generate all possible output values with each possible combination of input values for the decoder and encoder, the program producing tables of values for storage in a single encoder and decoder PROM, respectively, so that each sample value input to the respective PROM will be checked with the associated tables together with the current feedback value to produce the corresponding output value at the PROM outputs. This will clearly be much faster and more efficient than performing each calculation at the moment each new sample value is received.

At the moment the quantizer input levels are restricted by the size of available PROM to a 6 bit video input. However, when more advanced PROMs become available the same technique may be used with an 8 or more bit video input signal.

Thus, rather than directly transferring the DPCM functions to electronic circuit elements as in previous DPCM systems, the present invention provides PROMs preprogrammed with generated look up tables for the chosen quantizer input and output levels and ranges. This allows the previously used digital circuitry, commonly involving 30 or more integrated circuits working at high speeds, to be remapped into one PROM and one latch each for both the DPCM encoder and decoder. This reduces the device from 2 to 3 circuit boards to one or two small chips, consuming considerably less power, taking up much less space, and adding much less weight to video transmitters and receivers than previous DPCM systems. This clearly has significant advantages and makes the DPCM technique readily usable even where space and weight is restricted, for example in aircraft or space applications.

Thus, the system of this invention allows DPCM compression to be used with a minimum of circuit elements and with significantly reduced size, weight, and power requirements over the previously used conventional DPCM systems.

Although a preferred embodiment of the present invention has been described above by way of example, it will be understood by those skilled in the field that modifications may be made to the disclosed embodiment without departing from the scope of the invention, which is defined in the appended claims.

We claim:

1. A method of differential pulse code modulation compression of a video signal, comprising the steps of:
    selecting quantization levels and ranges for a predetermined range of video signals and selecting reconstructed signal levels for each quantization range;
    calculating, for each possible combination of each possible value of an incoming video signal in the predetermined range and a feedback signal comprising all possible values in the video signal range, a compressed video difference output signal according to the preselected quantization characteristic and a reconstructed video signal value corresponding to that video difference signal according to the preselected reconstructed signal levels;
    storing the calculated input, output and reconstructed signals in the form of look-up tables in an encoder PROM, the tables simulating an encoder quantization function and an encoder reconstructor function, the PROM having a quantizer function input, a feedback input, a quantizer function output, and a reconstructor function output;
    connecting the quantizer function input to a source of digital video signals;
    connecting the reconstructor function output to the feedback input via a latch for producing one pixel delay in the signal;
    controlling the PROM reconstructor function to form, for each incoming pair of video and feedback signals, the corresponding reconstructed video feedback signal and a quantizer function compressed video difference output signal, and to provide the reconstructed video signal at the reconstructor function output and the compressed video difference output signal at the quantizer function output; and
    connecting the compressed video difference output signal to a video transmitter.

2. The method of claim 1, including the additional steps of:
    calculating a table of reconstructed output video signal values for all possible values of the compressed video difference signal and a feedback signal comprising all possible values in the video input range;
    storing the table of input and output values in a decoder PROM for simulating a decoder reconstructor function and a decoder feedback function, the decoder PROM having a reconstructor function input, a feedback function input, and a reconstructor function output;
    connecting incoming compressed video signals to the reconstructor function input of the decoder PROM;
    connecting the reconstructor function output of decoder PROM to the feedback input of the decoder PROM via a latch for producing one pixel delay in the feedback signal; and controlling the PROM to look up for each incoming pair of compressed video difference and feedback signals the corresponding stored reconstructor function output signal and to provide that signal at the reconstruction function output.

3. The method of claim 1, wherein the step of calculating all possible reconstructed video signal values comprises adding each reconstructed video level to the current value of the feedback signal and multiplying the result by a predetermined feedback coefficient.

4. A system for transmitting compressed, DPCM encoded video signals, comprising:

a single PROM connected to a source of digital video signals in a predetermined input signal range, the PROM being preprogrammed with tables comprising all possible combinations of reconstructed video signals and output compressed video signals for each possible combination of values of an input video signal and a feedback signal in the predetermined range, the tables of values being calculated from preselected quantization levels and ranges, the PROM having a video signal quantizer function input, a feedback signal input, a compressed video signal output, and a reconstructor function output and being programmed to look up the corresponding compressed video signal and reconstructed signal for each pair of input signals and to provide these signals at its respective outputs; and a latch connected between the reconstructor function output and feedback signal input of the PROM, and clock means for controlling the latch to produce a one pixel delay in the feedback signal.

5. The system of claim 4, including a decoder for receiving a compressed DPCM coded video signal and for converting it into an expanded video signal for connection to a receiver, the decoder comprising:

a decoder PROM having a reconstructor function input for receiving a compressed DPCM coded video signal from the encoder, a feedback function input for receiving a feedback signal, and a reconstructor function output for providing a reconstructed video signal; the decoder PROM being preprogrammed with a table of values of all possible reconstructed output video signals for each possible pair of input signals; and a latch connected between the reconstructor function output and feedback input of the decoder PROM for producing one pixel delay in the output signal.

6. The system of claim 4, in which the input signal is a 6 bit digital video signal and the output signal is a 2 bit compressed signal.

* * * * *